(12) United States Patent
Tanwar (10) Patent No.: US 8,669,176 B1
(45) Date of Patent: Mar. 11, 2014

(54) BEOL INTEGRATION SCHEME FOR COPPER CMP TO PREVENT DENDRITE FORMATION

(75) Inventor: Kunaljeet Tanwar, Slingerlands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/596,198

(22) Filed: Aug. 28, 2012

(51) Int. Cl.
*H01L 21/4763* (2006.01)

(52) U.S. Cl.
USPC ........... 438/622; 438/620; 438/626; 438/629; 438/643; 438/653; 257/E21.584

(58) Field of Classification Search
None
See application file for complete search history.

(56) References Cited

U.S. PATENT DOCUMENTS

| 5,451,551 A * | 9/1995 | Krishnan et al. ............... 438/626 |
| 5,604,156 A * | 2/1997 | Chung et al. ................... 438/620 |
| 2005/0104216 A1* | 5/2005 | Cabral et al. ................... 257/758 |
| 2006/0014380 A1* | 1/2006 | Abe ............................... 438/629 |
| 2007/0077761 A1* | 4/2007 | Lehr et al. ...................... 438/687 |
| 2007/0269978 A1* | 11/2007 | Shih et al. ...................... 438/643 |
| 2009/0045519 A1* | 2/2009 | Kamikubo ..................... 257/773 |

* cited by examiner

*Primary Examiner* — Kyoung Lee
(74) *Attorney, Agent, or Firm* — Amerson Law Firm, PLLC (57) ABSTRACT

Disclosed herein are various methods of forming copper-based conductive structures on integrated circuit devices by performing a copper deposition process to fill the trench or via with copper, which can be performed by fill, plating or electroless deposition. Copper clearing of copper overburden is performed using CMP to stop on an existing liner. Copper in the trenches or vias is recessed by controlled etch. An Nblok cap layer is deposited to cap the trenches or vias so that copper is not exposed to ILD. Nblok overburden and adjacent liner is then removed by CMP. Nblok cap layer is then deposited. The proposed approach is an alternative CMP integration scheme that will eliminate the exposure of copper to ILD during CMP, will prevent any dendrite formation, can be used for all metal layers in BEOL stack, and can be utilized for multiple layers, as necessary, whenever copper CMP is desired.

23 Claims, 7 Drawing Sheets

BEOL INTEGRATION SCHEME FOR COPPER CMP TO PREVENT DENDRITE FORMATION

BACKGROUND OF THE INVENTION

1. Field of the Invention

Generally, the present disclosure relates to the manufacture of sophisticated semiconductor devices, and, more specifically, to various methods of forming copper-based conductive structures using a chemical mechanical planarization (CMP) integration scheme that eliminates exposure of copper to interlayer dielectric (ILD).

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that, to a great extent, substantially determines the performance capability of integrated circuit devices employing such transistors. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped source/drain regions.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as the channel length of the transistor. Thus, in modern ultra-high density integrated circuits, device features, like the channel length, have been steadily decreased in size to enhance the performance of the semiconductor device and the overall functionality of the circuit.

However, the ongoing shrinkage of feature sizes on transistor devices causes certain problems that may at least partially offset the advantages that may be obtained by reduction of the device features. Generally, decreasing the size of, for instance, the channel length of a transistor typically results in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate between adjacent transistors. Accordingly, the electrical resistance of conductive contact elements becomes a significant issue in the overall transistor design, since the cross-sectional area of these elements is correspondingly decreased. Moreover, the cross-sectional area of the contact vias, together with the characteristics of the materials they comprise, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "low-k" or ultra-low-k (ULK) dielectric materials (for example, materials having a dielectric constant less than 3) in such devices. Copper metallization systems exhibit improved electrical conductivity as compared to, for example, prior art metallization systems using aluminum for the conductive lines and vias. The use of low-k dielectric materials also tends to improve the signal-to-noise ratio (S/N ratio) by reducing crosstalk, as compared to other dielectric materials with higher dielectric constants.

However, the use of copper metallization systems with such low-k dielectric materials can be problematic. For example, after Back End of Line (BEOL) copper CMP, there is usually some amount of residual copper atoms/ions left on the surface (over exposed ILD). This residual copper can result in formation of dendrites due to copper oxidation. The presence of water will accelerate the dendrite growth which becomes a bigger problem for low-k ILD because it is porous and holds moisture. The dendrite can result in connecting copper lines resulting in shorting, capacitance and Time Dependent Dielectric Breakdown (TDDB) issues.

An existing approach to this problem is to deposit an Nblok cap layer after BEOL CMP. However, the queue time needs to be short, for example less than 6 hours. With this approach, the surface is capped before significant dendrite growth occurs. However, the short queue time needed is not ideal or practical for high volume manufacturing.

Another approach requires the use of commercially available chemicals for wafer cleaning, which can slow down the growth of dendrites post copper CMP. However, the use of such chemicals adds steps, complexity and cost to the manufacturing process.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive copper structures by performing a copper deposition process to fill the trench or via with copper, which can be performed by fill, plating or electroless deposition. Copper clearing of copper overburden is performed using CMP to stop on an existing liner. Copper in the trenches or vias is recessed—this may be performed by controlled etch. An Nblok cap layer is deposited to cap the trenches or vias so that copper is not exposed to ILD. Nblok overburden and adjacent liner is then removed—this can be performed by CMP. Nblok cap layer is then deposited.

The proposed approach is an alternative CMP integration scheme that will eliminate the exposure of copper to ILD during CMP. This approach will prevent any dendrite formation. The approach can be used for all metal layers in BEOL stack. This approach can be utilized for multiple layers, as necessary, whenever copper CMP is desired.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of copper CMP integration to prevent dendrite formation. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, ASIC's, logic devices, memory devices, etc. With reference to FIGS. 1-7, various illustrative embodiments of the methods disclosed herein will now be described in more detail.

Figure 1:
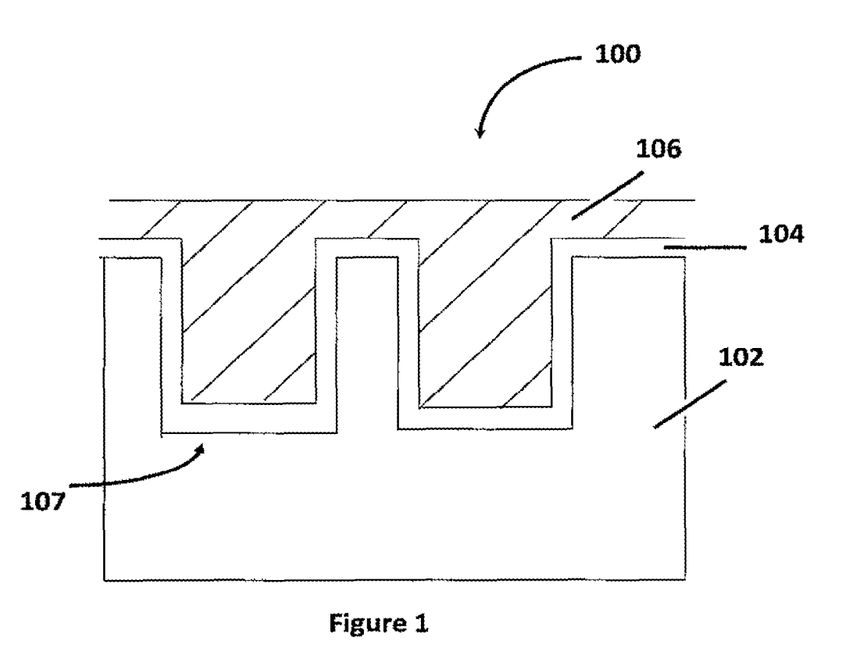
FIGS. 1-6 depict one illustrative novel process flow for integration of copper CMP.

FIG. 1 is a simplified view of an illustrative integrated circuit device 100 at an intermediate stage of manufacturing that is formed above a semiconducting substrate (not shown). The device 100 may be any type of integrated circuit device that employs any type of a conductive copper structure, such as a conductive line or via commonly found on integrated circuit devices. The various components and structures of the device 100 may be initially formed using a variety of different materials and by performing a variety of known techniques. The point of fabrication depicted in FIG. 1 is after M1 copper plating or fill. A barrier layer 104 has been formed over an ILD 102. Copper layer 106 is formed over the barrier layer 104, for example in one embodiment by plating or fill. Barrier layer 104 may be any of a variety of materials, for example, tantalum nitride, tantalum, titanium nitride, titanium-tungsten, tungsten, tungsten nitride, titanium silicon nitride, silicon nitride, cobalt or ruthenium, etc. The barrier layer 104 may be formed by performing a physical vapor deposition (PVD) process, an atomic layer deposition (ALD) process, a chemical vapor deposition (CVD) process or plasma-enhanced versions of such processes. In some applications, ruthenium or a ruthenium alloy may be employed on top of the barrier layer material because it bonds strongly with copper metal, which may improve the device's electromigration resistance. Cobalt or a cobalt alloy may also be employed as a part of the barrier layer material since it also tends to bond very well with copper metal. The copper layer 106 is intended to be representative of any type of a conductive copper structure, of any desired shape, depth or configuration. For example, in some embodiments, the copper layer 106 does not extend to an underlying layer of material. In other embodiments, the copper layer 106 may extend all of the way through a layer of insulating material to an underlying layer of material or an underlying conductive structure. The copper layer 106 and barrier layer 104 include portions within trench or via regions 107. Thus, the shape, size, depth or configuration of copper layer 106 should not be considered to be a limitation of the present invention.

Figure 2:
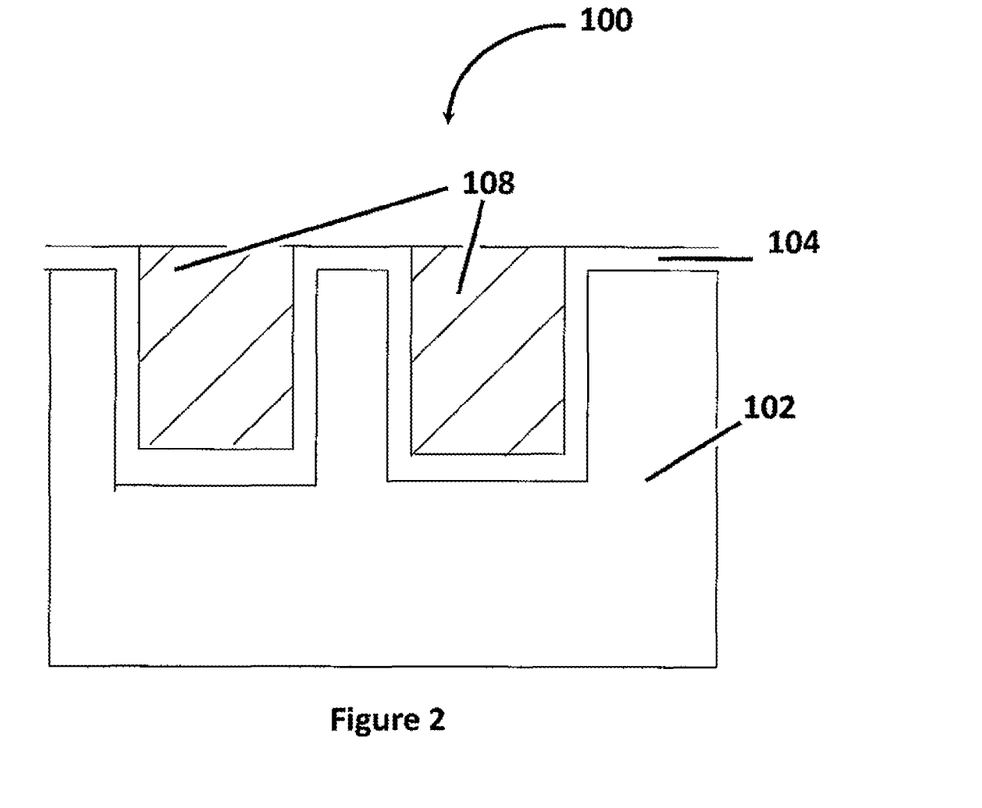

Thereafter, as shown in FIG. 2, copper clearing is performed to stop on barrier layer 104. This leaves copper structures 108 flush with barrier layer 104. In one embodiment, copper clearing may be performed using selective CMP.

Figure 3:
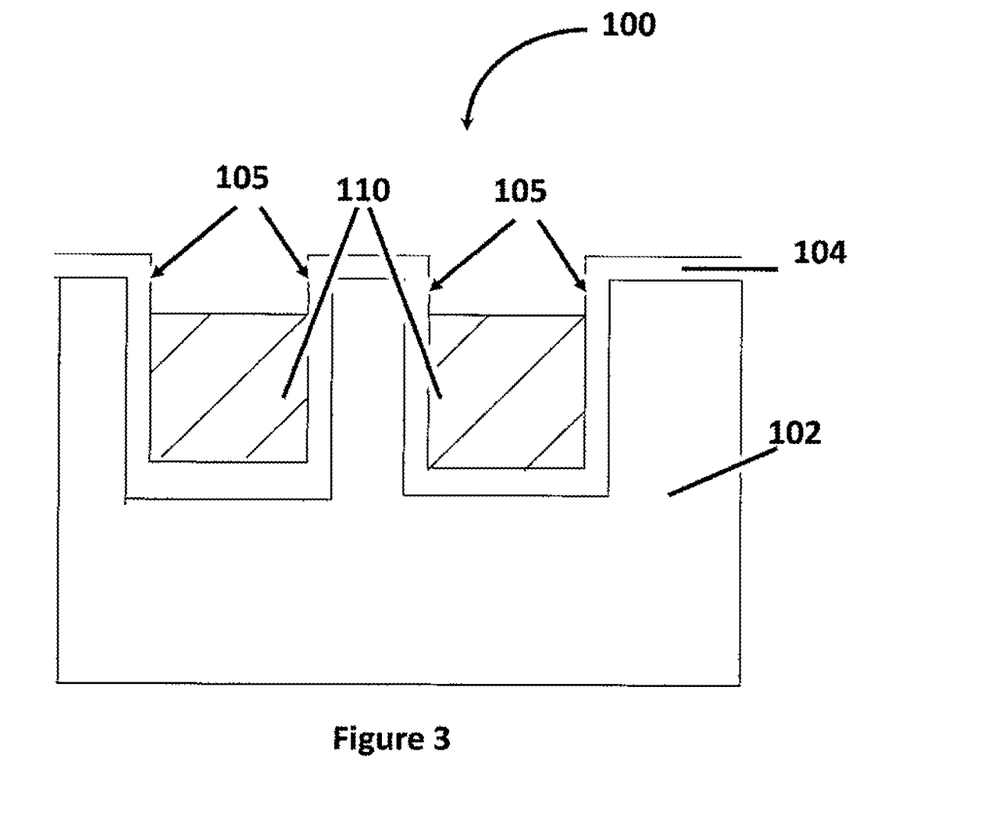

Thereafter, as shown in FIG. 3, recessed copper structures 110 are formed. Recessed copper structures 110 may be formed by an etching process. In one illustrative embodiment, the etching process may be a wet etching process using hydrochloric acid and peroxide as the etchant material. The etching process exposes at least barrier layer portions 105 of the barrier layer 104. In one embodiment, recessed copper structures 110 may be recessed a depth of 10-40 nm.

Figure 4:
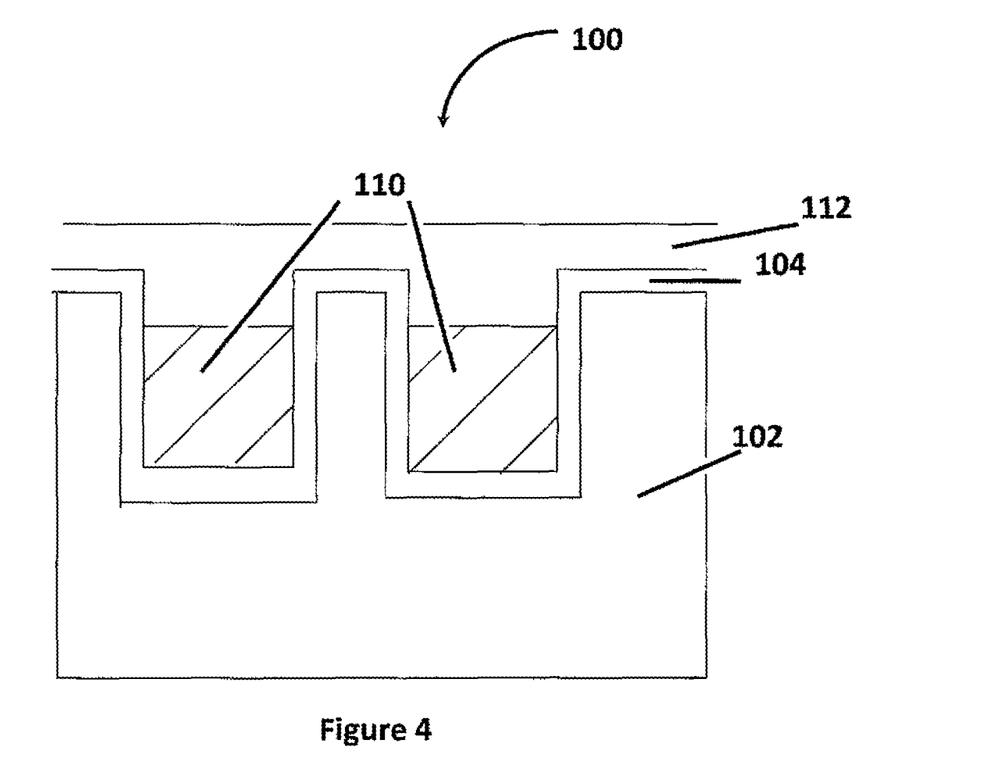

Next, as shown in FIG. 4, a cap layer 112 is deposited. The cap layer 112 is formed over barrier layer 104, barrier layer portions 105, and recessed copper structures 110. In one embodiment, the cap layer 112 may be Nblok or SiN.

Figure 5:
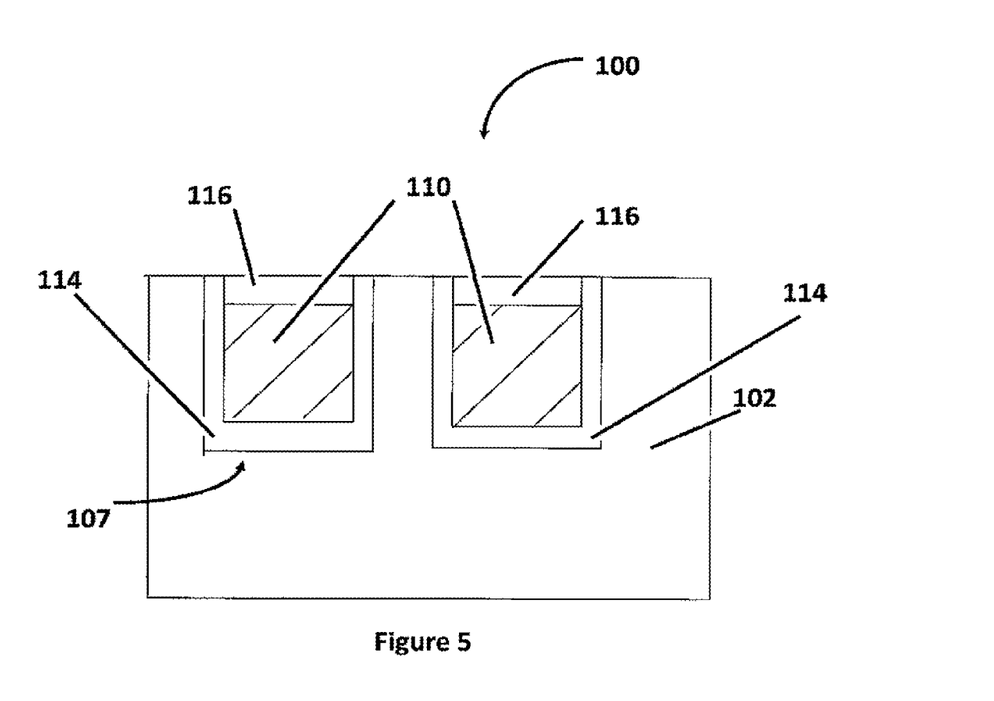

Next, as shown in FIG. 5, a CMP process may be performed on the device 100 to remove an overburden portion of cap layer 112 and adjacent portions of barrier liner 104 positioned outside of the trench or via regions 107 to thereby define recessed copper structures 110 positioned in the trench or via regions 107 and covered by cap structures 116 which are flush with ILD 102. In one embodiment, the remaining cap structure 116 may be 1-10 nm in depth. Copper will not be exposed during this CMP, resulting in no residual copper at wafer and ILD surfaces. This prevents dendrite formation and will potentially improve TDDB performance.

Figure 6:
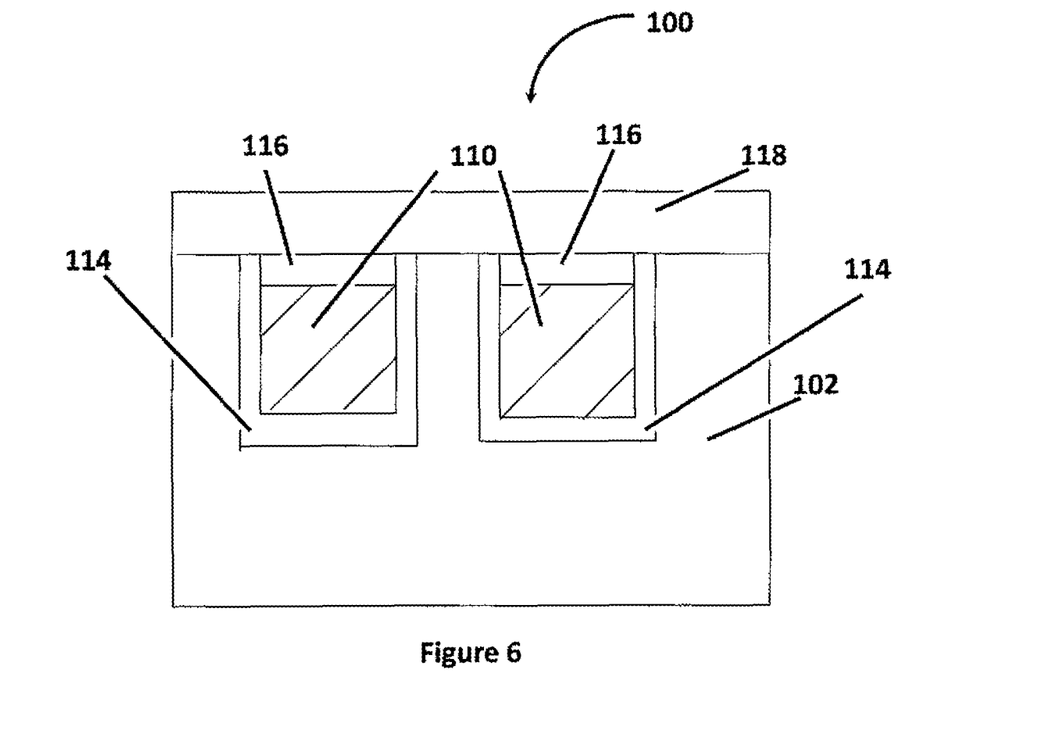

Next, as shown in FIG. 6, a second cap layer 118 is deposited. In one embodiment, the second cap layer 118 may be Nblok or SiN, and may be the same material as the cap structure 116. CMP may be performed on the second cap layer 118 to obtain a substantially flat surface.

Note that using the novel process disclosed herein, the problem of the large quantity of copper material that is typically associated with a traditional electroplating process is not present. Dendrite formation post copper CMP is a problematic defect (e.g., leakage, TDDB performance issues) and BEOL stack with ULK are more prone to these defects. The proposed process approach will prevent dendrite formation post copper CMP by eliminating exposure of copper during liner/ILD CMP step. This will result in no copper exposed to ILD at the surface, therefore preventing dendrite growth.

Figure 7:
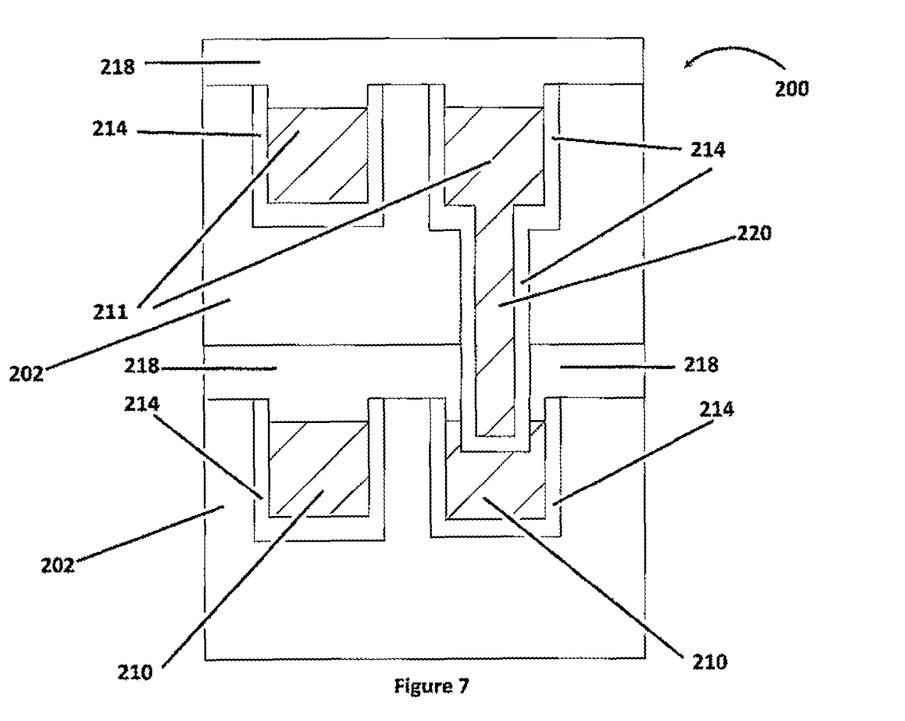
FIG. 7 depicts an example of applying this process at other metal layers providing BEOL interconnects which are free of dendrites.

FIG. 7 depicts an illustrative integrated circuit device 200 at a stage of manufacturing that is post M2 lithography, etch, CMP and cap layer deposition. Representations of M1 copper structures 210 and M2 copper structures 211 are shown along with BEOL interconnect, or via, 220. Cap layers 218 and barrier layers 214 are formed on ILD layers 202 using steps outlined in FIGS. 1-6. In one embodiment, cap layers 218 may be Nblok or SiN. Applying the method outlined in FIGS. 1-6 at other metal layers provides BEOL interconnects which are free of dendrites.

As another embodiment, the copper clearing shown in FIG. 2 is performed to stop on ILD 102. Instead, this leaves copper structures 108 flush with ILD 102. Thereafter, similarly as shown in FIG. 3, recessed copper structures 110 are formed. Next, similarly as shown in FIG. 4, a cap layer 112 is deposited. The cap layer 112 is polished to create a flat surface. This alternative minimizes, but does not completely prevent, the exposure of ILD to copper. However, this alternative has the advantage of a reduced set of process steps.

The approach is applicable for all technology nodes (e.g., 32 nm-10 nm and beyond) and will facilitate use of ULK materials in BEOL stack. The approach can also improve TDDB performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
    providing an integrated circuit structure comprising:
    a first interlayer dielectric (ILD) formed above a substrate;
    a first plurality of trenches formed in the first ILD;
    a first barrier layer formed over the first ILD; and
    a first copper layer formed over the first barrier layer;
    removing a portion of the first copper layer to form a first plurality of copper structures flush with the first barrier layer;
    removing a portion of the first plurality of copper structures flush with the first barrier layer to form a first plurality of recessed copper structures;
    forming a first cap layer over the first plurality of recessed copper structures and the first barrier layer;
    removing a portion of the first cap layer and a portion of the first barrier layer to form a first plurality of cap structures flush with the first ILD; and
    forming a second cap layer over the first ILD, the first barrier layer and the first plurality of cap structures, wherein the first cap layer and the second cap layer are made of the same material.

2. The method according to claim 1, wherein the first cap layer is either Nblok or SiN, and the second cap layer is the same as the first cap layer.

3. The method according to claim 1, wherein the first plurality of cap structures have a thickness of 1-10 nm.

4. The method according to claim 1, wherein removing a portion of the first plurality of copper structures flush with the first barrier layer to form a first plurality of recessed copper structures comprises removing 10 nm to 40 nm from the first plurality of copper structures.

5. The method according to claim 4, wherein removing a portion of the first plurality of copper structures flush with the first barrier layer to form a first plurality of recessed copper structures comprises performing a wet etching process using hydrochloric acid and peroxide as the etchant material.

6. The method according to claim 1, wherein the first barrier layer contains cobalt or a cobalt alloy.

7. The method according to claim 1, wherein the first ILD is a low-k dielectric material with a dielectric constant less than 3.

8. The method according to claim 1, wherein the integrated circuit structure further comprises at least one via formed in the ILD.

9. The method according to claim 1, further comprising:
    removing a portion of the second cap layer to leave a flat surface, wherein removing a portion of the second cap layer comprises performing a CMP process.

10. The method according to claim 1, further comprising:
    an electromigration resistance layer formed on top of the first barrier layer, wherein the electromigration resistance layer is ruthenium or a ruthenium alloy layer.

11. The method according to claim 1, further comprising:
    forming a second ILD above the second cap layer;
    forming a second plurality of trenches in the second ILD; and
    forming at least one via in the second ILD, wherein the at least one via extends to one of the first plurality of recessed copper structures.

12. The method according to claim 11, further comprising:
    forming a second barrier layer over the second ILD and at least one via;
    forming a second copper layer over the second barrier layer;
    removing a portion of the second copper layer to form a second plurality of copper structures flush with the second barrier layer; and
    removing a portion of the second plurality of copper structures flush with the barrier layer to form a second plurality of recessed copper structures.

13. The method according to claim 12, further comprising:
    forming a third cap layer over the second plurality of recessed copper structures and the second barrier layer;
    removing a portion of the third cap layer and a portion of the barrier layer to form a second plurality of cap structures flush with the second ILD; and
    forming a fourth cap layer over the second ILD, the second barrier layer and the third cap layer.

14. The method according to claim 13, wherein the first cap layer is either Nblok or SiN, the second cap layer is either Nblok or SiN, the third cap layer is either Nblok or SiN, and the fourth cap layer is either Nblok or SiN.

15. The method according to claim 12, wherein forming a second copper layer over the second barrier layer comprises performing a fill process, a plating process or an electroless deposition process.

16. The method according to claim 12, wherein removing a portion of the second plurality of copper structures flush with the barrier layer to form a second plurality of recessed copper structures comprises performing a wet etching process using hydrochloric acid and peroxide as the etchant material.

17. The method according to claim 11, wherein the first ILD and the second ILD are a low-k dielectric material with a dielectric constant less than 3.

18. The method according to claim 1, wherein removing a portion of the first cap layer and a portion of the first barrier layer to form a first plurality of cap structures flush with the first ILD comprises performing a CMP process.

19. The method according to claim 13, wherein the second plurality of cap structures have a thickness of 1-10 nm.

20. A method of forming a device, comprising:
providing an integrated circuit structure comprising:
a first interlayer dielectric (ILD) formed above a substrate;
a first plurality of trenches formed in the first ILD;
a first barrier layer formed over the first ILD; and
a first copper layer formed over the first barrier layer;
removing a portion of the first copper layer to form a first plurality of copper structures flush with the first barrier layer;
removing a portion of the first plurality of copper structures flush with the first barrier layer to form a first plurality of recessed copper structures;
forming a first cap layer over the first plurality of recessed copper structures and the first barrier layer;
removing a portion of the first cap layer and a portion of the first barrier layer to form a first plurality of cap structures flush with the first ILD; and
forming a second cap layer over the first ILD, the first barrier layer and the first plurality of cap structures, wherein the first cap layer and the second cap layer are made of non-conductive materials.

21. The method of claim 20, wherein said first and second cap layers are comprised of the same material.

22. The method according to claim 20, wherein the first cap layer is either Nblok or SiN, and the second cap layer is the same as the first cap layer.

23. A method of forming a device, comprising:
providing an integrated circuit structure comprising:
a first interlayer dielectric (ILD) formed above a substrate;
a first plurality of trenches formed in the first ILD;
a first barrier layer formed over the first ILD
an electromigration resistance layer formed on top of the first barrier layer, wherein the electromigration resistance layer is ruthenium or a ruthenium alloy layer; and
a first copper layer formed above the electromigration resistance layer;
removing a portion of the first copper layer to form a first plurality of copper structures flush with one of the electromigration resistance layer or the first barrier layer;
removing a portion of the first plurality of copper structures to form a first plurality of recessed copper structures;
forming a first cap layer over the first plurality of recessed copper structures and one of the electromigration resistance layer or the first barrier layer;
removing a portion of the first cap layer and a portion at least one of the electromigration resistance layer or of the first barrier layer to form a first plurality of cap structures flush with the first ILD; and
forming a second cap layer over the first ILD, the first barrier layer and the first plurality of cap structures.

* * * * *